(12) United States Patent
Do

(10) Patent No.: US 7,315,478 B2
(45) Date of Patent: Jan. 1, 2008

(54) INTERNAL VOLTAGE GENERATOR FOR A SEMICONDUCTOR MEMORY DEVICE

(75) Inventor: Chang-Ho Do, Ichon-shi (KR)

(73) Assignee: Hynix Semiconductor, Inc., Kyoungki-Do (KR)

( * ) Notice: Subject to any disclaimer, the term of this patent is extended or adjusted under 35 U.S.C. 154(b) by 114 days.

(21) Appl. No.: 11/167,394

(22) Filed: Jun. 28, 2005

(65) Prior Publication Data

US 2006/0140020 A1 Jun. 29, 2006

(30) Foreign Application Priority Data

Dec. 28, 2004 (KR) ...................... 10-2004-0113626

(51) Int. Cl.
G11C 7/06 (2006.01)
G11C 5/14 (2006.01)
G11C 7/00 (2006.01)
(52) U.S. Cl. ........................... 365/189.09; 365/189.07; 327/54
(58) Field of Classification Search ........... 365/189.07, 365/189.09; 327/54
See application file for complete search history.

(56) References Cited

U.S. PATENT DOCUMENTS

| 4,602,205 A | * | 7/1986 | Matsuhashi et al. | ........ 320/166 |
| 4,769,784 A | * | 9/1988 | Doluca et al. | .............. 365/149 |
| 5,969,557 A | * | 10/1999 | Tanzawa et al. | ............ 327/291 |
| 6,529,421 B1 | * | 3/2003 | Marr et al. | ............ 365/189.09 |
| 6,791,395 B2 | * | 9/2004 | Kim | ........................... 327/536 |
| 2005/0062520 A1 | * | 3/2005 | Kim et al. | .................. 327/536 |
| 2005/0073355 A1 | * | 4/2005 | Sivero et al. | ............... 327/536 |
| 2005/0168263 A1 | * | 8/2005 | Fukuda et al. | .............. 327/535 |

FOREIGN PATENT DOCUMENTS

KR 2002-0044200 A 6/2002

* cited by examiner

*Primary Examiner*—Ly Duy Pham
(74) *Attorney, Agent, or Firm*—McDermott Will & Emery LLP

(57) ABSTRACT

Provided is an internal voltage generator for a semiconductor memory includes: a first internal voltage drive device for driving an internal voltage in response to a first reference voltage corresponding to a target level of an internal voltage; and a second internal voltage drive device for driving the internal voltage in response to a second reference voltage having a lower level than the first reference voltage.

11 Claims, 5 Drawing Sheets

INTERNAL VOLTAGE GENERATOR FOR A SEMICONDUCTOR MEMORY DEVICE

FIELD OF THE INVENTION

The present invention relates to a semiconductor design technology; and, more particularly, to an internal voltage generator for use in a semiconductor memory device.

DESCRIPTION OF RELATED ART

In general, a cell size within a semiconductor memory chip becomes gradually small as the semiconductor memory chip is high integrated, and also an operating voltage becomes more low due to such small size cell. Most of such semiconductor memory chips are provided with an internal voltage generator for generating an internal voltage, required for operation of various circuits within those chips, using a power supply voltage VDD from an outside circuit. It is known that main issue on designing such internal voltage generator is to supply required level of internal voltage safely.

In an internal voltage generator that generates a core voltage (VCORE), used in amplifying cell data, which is the most typical internal voltage, there has been configured a voltage down converter.

FIG. 1 is a circuit diagram showing a conventional core voltage generator.

As shown, the conventional core voltage generator comprises a comparator 10 for comparing a reference voltage VR with a level of a feedback core voltage VCORE, and a PMOS transistor M1, which is connected between a power supply voltage port VDD and a core voltage port VCORE that is an output port, whose gate is coupled to an output signal drv_onb from the comparator 10. Herein, it is preferable that the comparator 10 is implemented by using a general current mirror type differential amplifier.

FIG. 2 depicts a timing diagram illustrating the operation of the core voltage generator shown in FIG. 1, which will be described in detail below.

Specifically, if there exists dissipation of core current Ivcore by a drive of bit line sensing amplifier in the semiconductor memory device, a voltage drop of the core voltage VCORE is occurred. Then, the comparator 10 compares the reference voltage VR with the feedback core voltage VCORE in order to activate the drive control signal drv_onb with logic low level if the core voltage VCORE is lower than the reference voltage VR. By doing so, a pull-up PMOS transistor M1 is turned-on, making the core voltage port to be pull-up driven. In the above, an electrical potential at the core voltage port VCORE is decided based on a consumption amount of the core current Ivcore and a drive force of the pull-up PMOS transistor M1.

As such, if a level of the core voltage VCORE reaches to the reference voltage VR after the electrical potential at the core voltage port VCORE passes through a recovery progress, then the drive control signal drv_onb is in logic high level and the pull-up PMOS transistor M1 is turned-off, preventing a level of voltage at the core voltage port VCORE from increasing any further.

However, there is a limitation to the response characteristics of the comparator 10, and thus, the pull-up PMOS transistor M1 continues to conduct pull-up drive operation, during a certain period tB, until the drive control signal drv_onb becomes inactivated with logic high level, even after the level of the feedback core voltage VCORE reaches to the reference voltage VR. Consequently, the electrical potential at the core voltage port VCORE is maintained to have a higher level ΔV than the target reference voltage VR.

After that, if there is again occurred a consumption of the core current Ivcore, the comparator 10 is operated, while allowing the core voltage level fluctuated within range of an interval ΔV' in a same manner as mentioned above. Herein, tA indicates a drive-on response time and tB represents a drive-off response time.

In the meantime, in order to secure stable core voltage level under the circumstance that the power supply voltage VDD is gradually low and consumption amount of the core current is not almost varied, there has been a necessity to increase a drive force with respect to the core voltage port by doing an increase in size of the pull-up PMOS transistor M1.

However, such scheme that allows the size of the pull-up PMOS transistor M1 to increase results in an excessive increase in the core voltage level due to a response characteristics limitation of the comparator 10 as shown in FIG. 3, and also causes a serious fluctuation of the core voltage level during a continuous operation that makes the core current Ivcore consumed, which does not perform a stable bit line sensing amplification operation.

SUMMARY OF THE INVENTION

It is, therefore, a primary object of the present invention to provide an internal voltage generator for a semiconductor memory device that is capable of providing an internal voltage of constant level stably, while guaranteeing a drive force with respect to an interval voltage port.

In accordance with one aspect of the present invention, there is provided an internal voltage generator for use in a semiconductor memory device including: a first internal voltage drive means for driving an internal voltage port in response to a first reference voltage corresponding to an internal voltage target electrical potential; and a second internal voltage drive means for driving the internal voltage port in response to a second reference voltage with electrical potential which is smaller than the first reference voltage.

In accordance with another aspect of the present invention, there is provided an internal voltage generator for use in a semiconductor memory device, the apparatus comprising: a first comparison means for comparing a first reference voltage corresponding to a target electrical potential of an internal voltage with a level of a feedback internal voltage; a first pull-up drive means for pull-up driving an internal voltage port in response to a first drive control signal from the first comparison means; a second comparison means for comparing a second reference voltage with an electrical potential which is less than the first reference voltage with a level of the feedback internal voltage; and a second pull-up drive means for pull-up driving the internal voltage port in response to a second drive control signal from the second comparison means.

In accordance with still another aspect of the present invention, there is provided an internal voltage generator for use in a semiconductor memory device, the apparatus comprising: a first comparison means for comparing a first reference voltage corresponding to a target electrical potential of an internal voltage with a level of a feedback internal voltage; a first pull-up drive means for pull-up driving an internal voltage port in response to a first drive control signal from the first comparison means; a test mode decision means for generating an internal voltage test mode enable signal; a multiplexing means for generating as a second reference voltage one of a plurality of reference voltages with different levels, which are less than a level of the first reference voltage, in response to the internal voltage test mode enable signal; a second comparison means for comparing the second reference voltage from the multiplexing means with the level of the feedback internal voltage; and a second pull-up drive means for pull-up driving the internal voltage port in response to a second drive control signal from the second comparison means.

BRIEF DESCRIPTION OF THE DRAWINGS

The above and other objects and features of the instant invention will become apparent from the following description of preferred embodiments taken in conjunction with the accompanying drawings, in which.

DETAILED DESCRIPTION OF THE INVENTION

Hereinafter, to explain the present invention so that a person skilled in the art could easily conceive the technical spirit to which the invention belongs, most preferred embodiments of the present invention will be described in detail with reference to the accompanying drawings.

Figure 1:
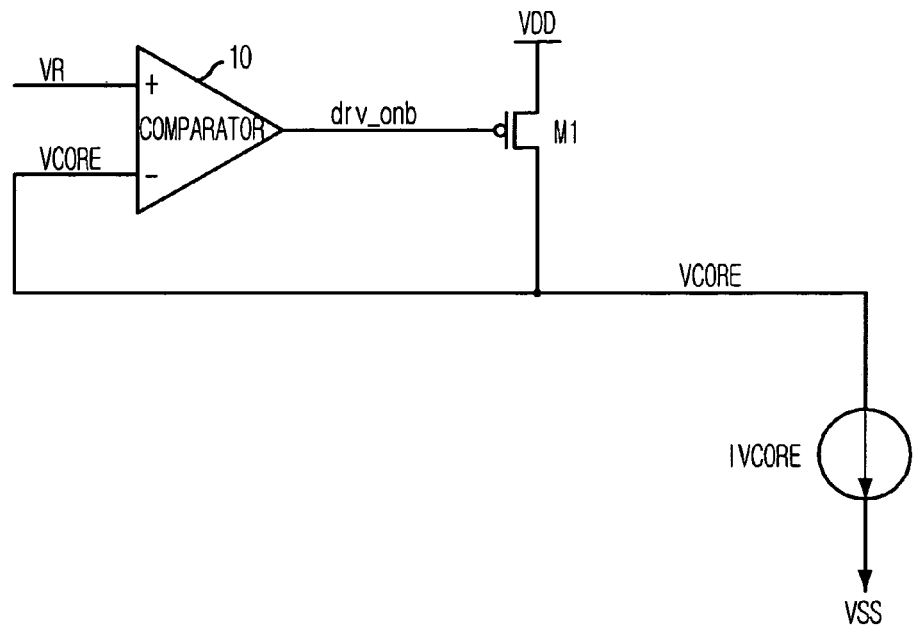
FIG. 1 is a circuit diagram illustrating a conventional core voltage (VCORE) generator.
Figure 2:
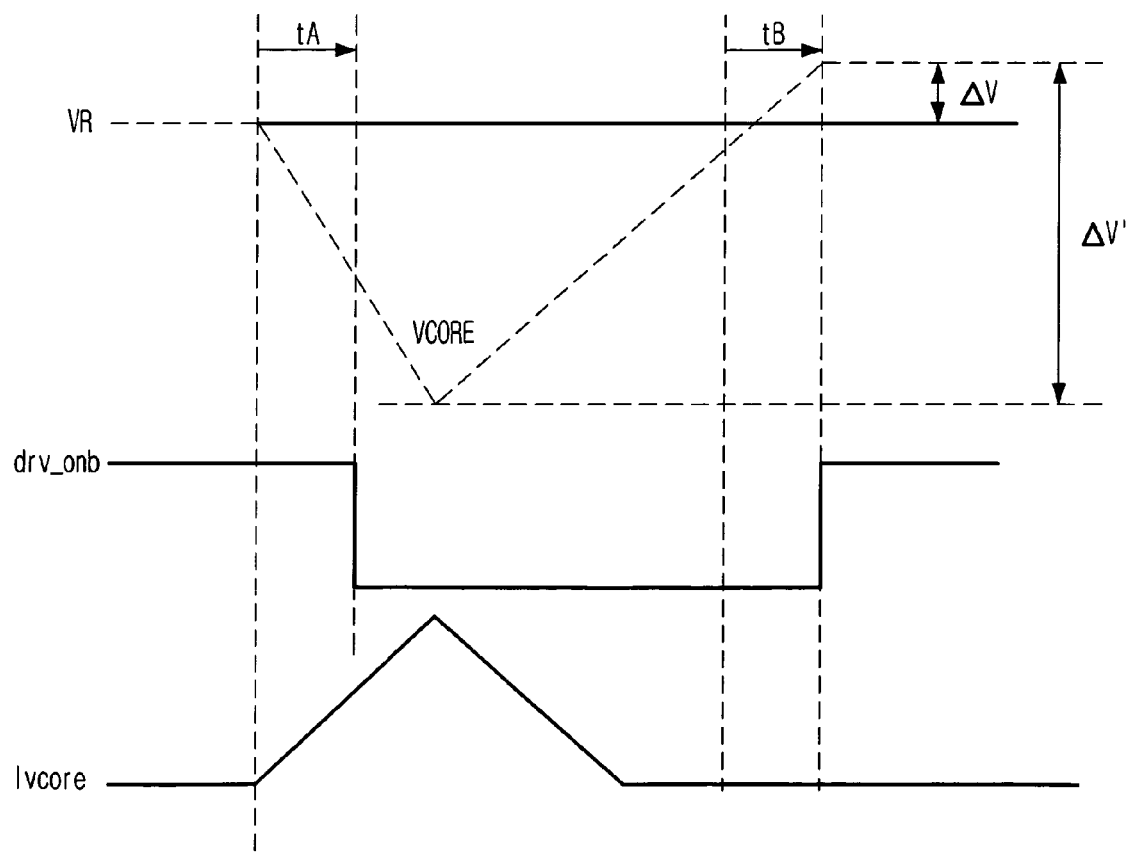
FIG. 2 is a timing diagram for explaining the operation of the core voltage generator shown in FIG. 1.
Figure 3:
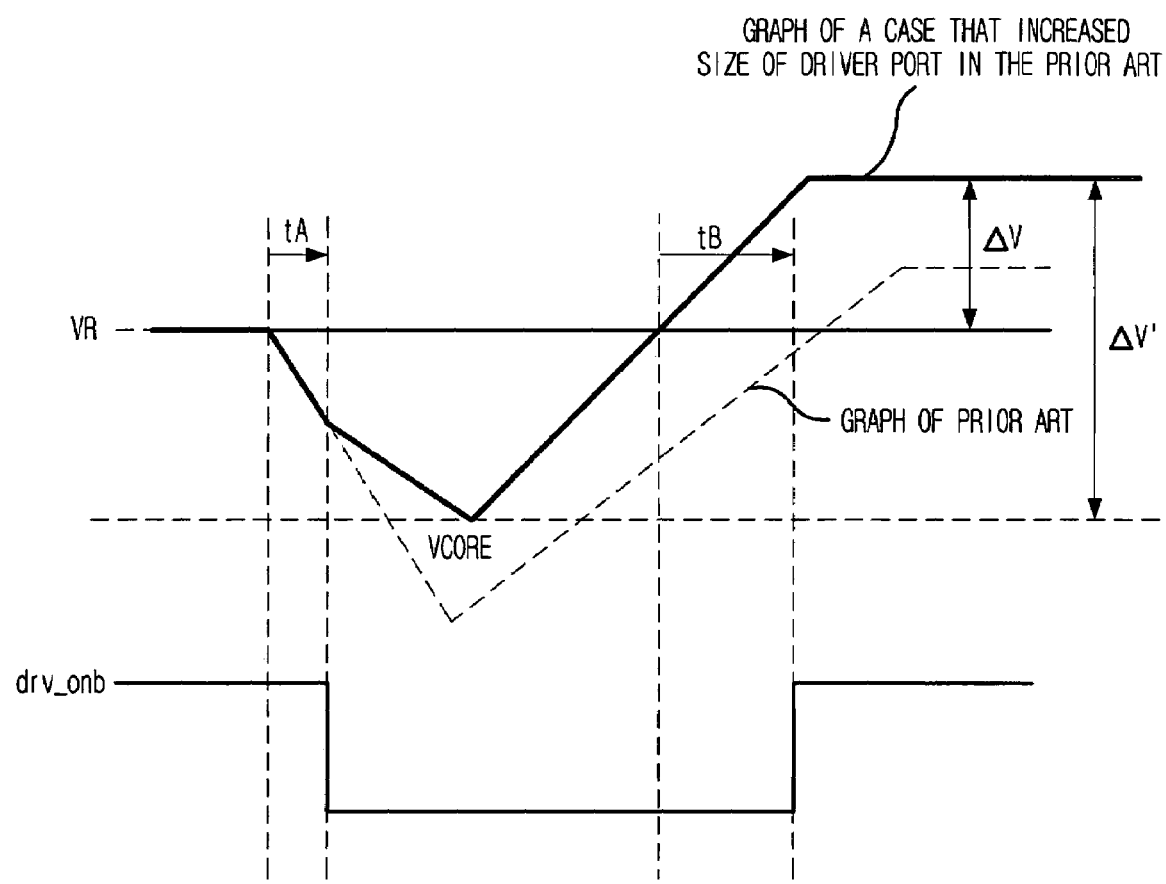
FIG. 3 is a timing diagram showing an enhanced drive force at an internal voltage terminal according to the prior art.
Figure 4:
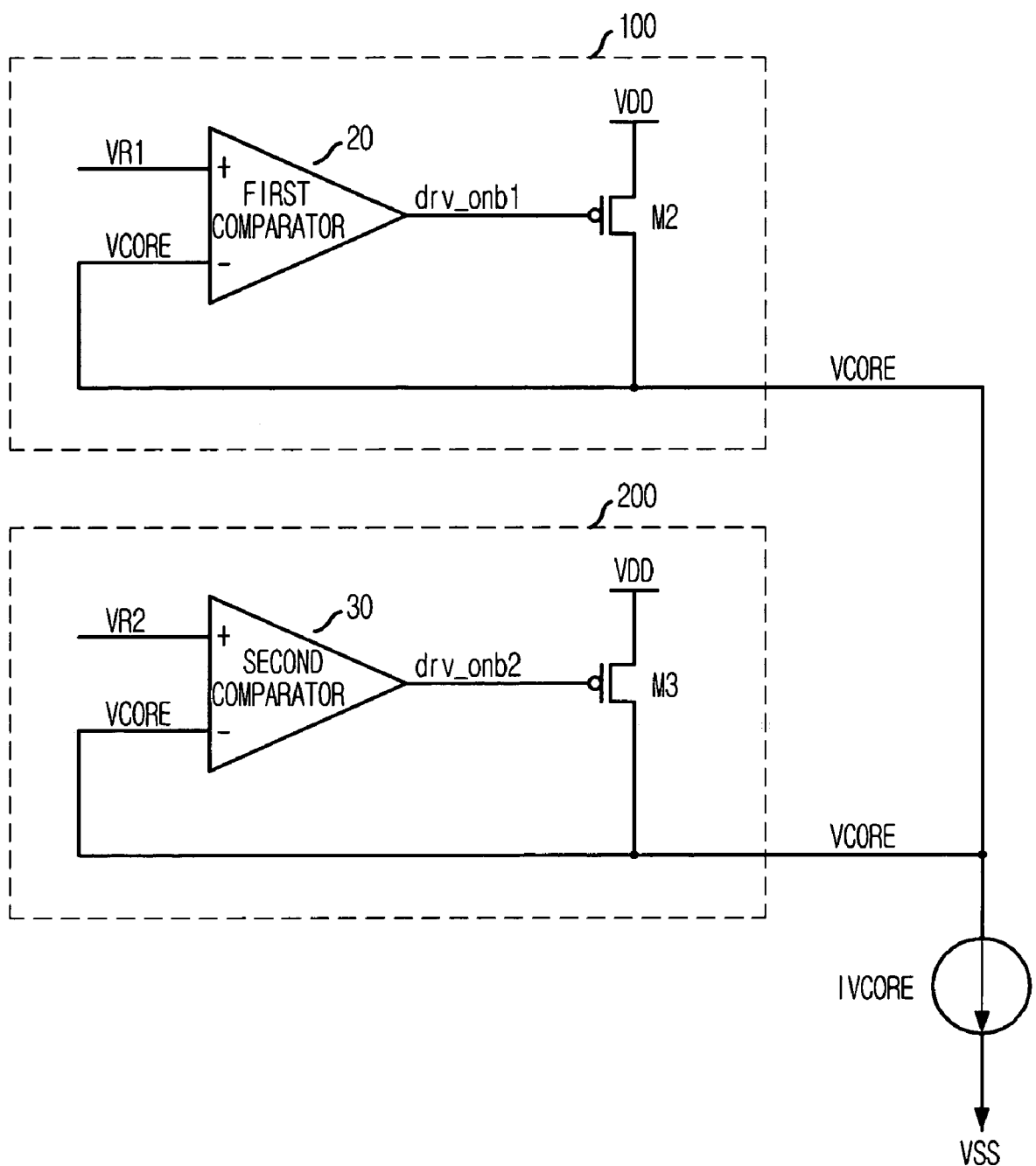
FIG. 4 is a circuit diagram illustrating a core voltage generator in accordance with one preferred embodiment of the present invention.

FIG. 4 shows a circuit diagram of a core voltage generator in accordance with a preferred embodiment of the present invention.

As shown in FIG. 4, the core voltage generator of the present invention generally comprises a first core voltage driver 100 for driving a core voltage terminal VCORE in response to a first reference voltage VR1 with a target electrical potential; and a second core voltage driver 200 for driving the core voltage terminal VCORE in response to a second reference voltage VR2 with an electrical potential which is smaller than the first reference voltage VR1.

Herein, the first core voltage driver 100 includes a first comparator 20 for comparing a first reference voltage VR1 with a level of a feedback core voltage VCORE, and a first pull-up PMOS transistor M2, connected between a power supply voltage port VDD and the core voltage port VCORE which is an output port, and whose gate is coupled to a first drive control signal drv_onb1 from the first comparator 20.

Similarly, the second core voltage driver 200 includes a second comparator 30 for comparing a second reference voltage VR2 with the level of the feedback core voltage VCORE, and a second pull-up PMOS transistor M3, connected between the power supply voltage port VDD and the core voltage port VCORE which is the output port, and whose gate is coupled to a second drive control signal drv_onb2 from the second comparator 30.

Figure 5:
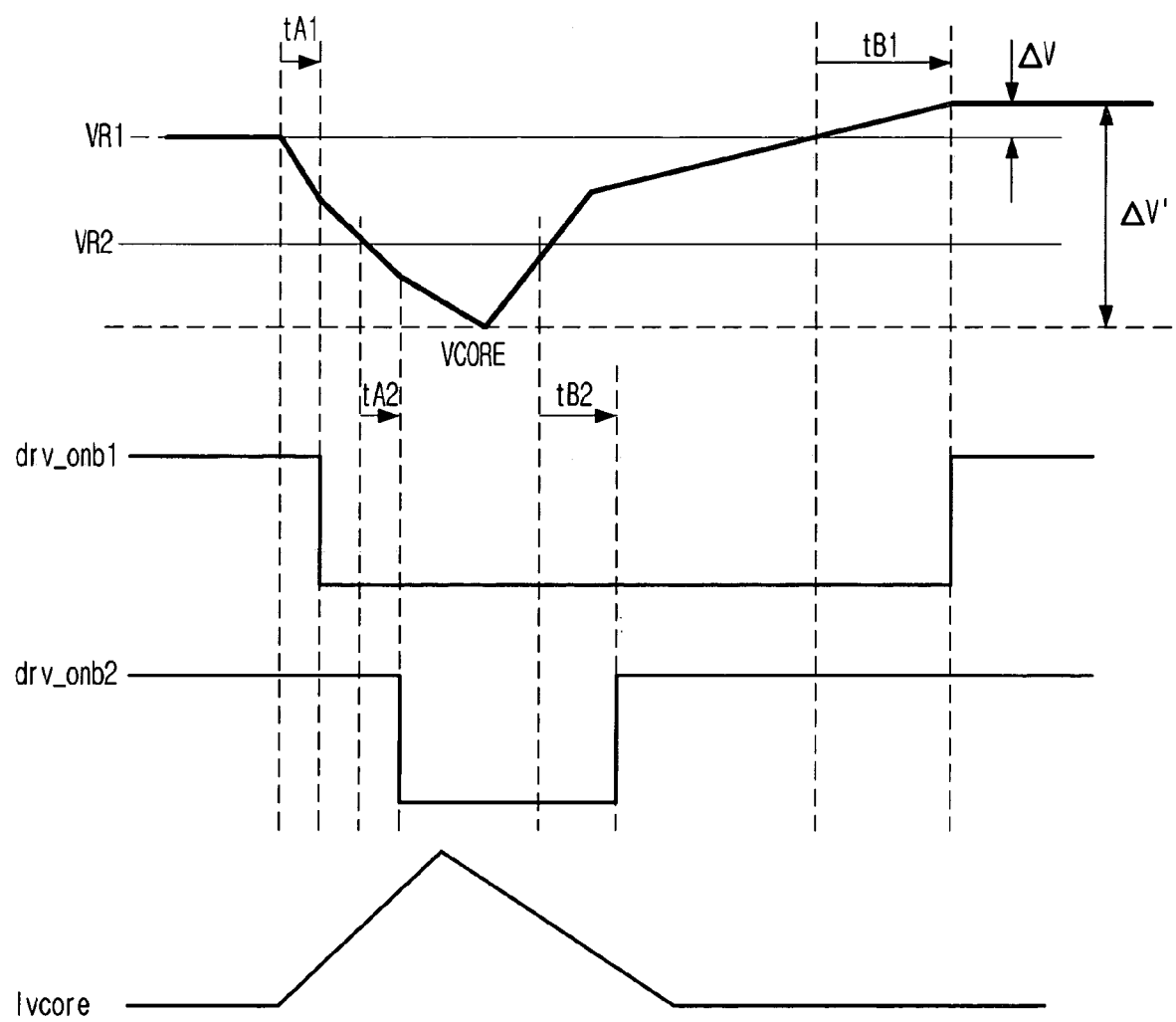
FIG. 5 is a timing diagram for explaining the operation of the core voltage generator shown in FIG. 4.

FIG. 5 is a timing diagram showing the operation of the core voltage generator shown in FIG. 4, wherein its operation will be described in detail referring to the figure below.

First of all, if a bit line sensing amplifier in a semiconductor device is driven and a core current Ivcore is consumed, then a voltage drop of the core voltage VCORE is occurred. When the first comparator 20 senses the voltage drop mentioned above, it activates the first drive control signal drv_onb1 with logic low state. Through such activation, the first pull-up PMOS transistor M2 is turned-on, making the core voltage terminal VCORE to be pull-up driven. Meanwhile, during a time interval from a time the core voltage level is less than a level of the first reference voltage VR1 to a time the first drive control signal drv_onb1 is activated, there exists a delay by a drive-on response time tA1 of the first comparator 20. In such case, if a drive force of the first pull-up PMOS transistor M2 does not cope with a consumption amount of the core current Ivcore, an electrical potential at the core voltage terminal VCORE is decreased further.

As such, if the electrical potential at the core voltage terminal VCORE is decreased to be less than the second reference voltage VR2, then the second comparator 30 senses such state and activates the second drive control signal drv_onb2 with logic low level. By doing so, the second pull-up PMOS transistor M3 is turned-on, making the core voltage terminal VCORE to be pull-up driven with the first pull-up PMOS transistor M2. Therefore, the degree of decrease in the electrical potential at the core voltage terminal VCORE is rapidly low, and then the electrical potential starts to increase while decreasing the consumption amount of the core current Ivcore thereafter. Herein, during a time period from a time the core voltage level is less than a level of the second reference voltage VR2 to a time the second drive control signal drv_onb2 is activated, there exists a delay by a drive-on response time tA2 of the second comparator 30.

Meanwhile, if a level of the core voltage VCORE reaches to the reference voltage VR while the electrical potential at the core voltage port VCORE passes through a recovery progress, then the second comparator 30 senses such state and inactivates the second drive control signal drv_onb2 with logic high level, leading to turn-off of the second pull-up PMOS transistor M3. In the above, during a time period from a time the core voltage level recoveries a level of the second reference voltage VR2 to a time the second drive control signal drv_onb2 is inactivated, there is occurred a delay by a drive-off response time tB2 of the second comparator 30.

After that, the first pull-up PMOS transistor M2 drives the core voltage terminal VCORE independently, and therefore, an increase slope of the core voltage becomes slow. As such, if the core voltage level reaches to the first reference voltage VR1 after its increase, then the first comparator 20 senses such state and inactivates the first drive control signal drv_onb1 with logic high level, allowing the first pull-up PMOS transistor M2 to be turned-on. Herein, during a time period from a time the core voltage level recoveries a level of the first reference voltage VR1 to a time the first drive control signal drv_onb1 is inactivated, there leads to a delay by a drive-off response time tB1 of the first comparator 20.

Accordingly, under the state that an increase slope of the core voltage level is slow at a time point while the core voltage level is excessively increased by ΔV during a period of tB1, it would be possible to slow a value ΔV compared to a case that only drive force at the core voltage terminal is increased. Also, since the drive force with respect to the core voltage port VCORE is increased along with the state, it would be possible to highly decrease the entire core voltage fluctuation ΔV'.

Figure 6:
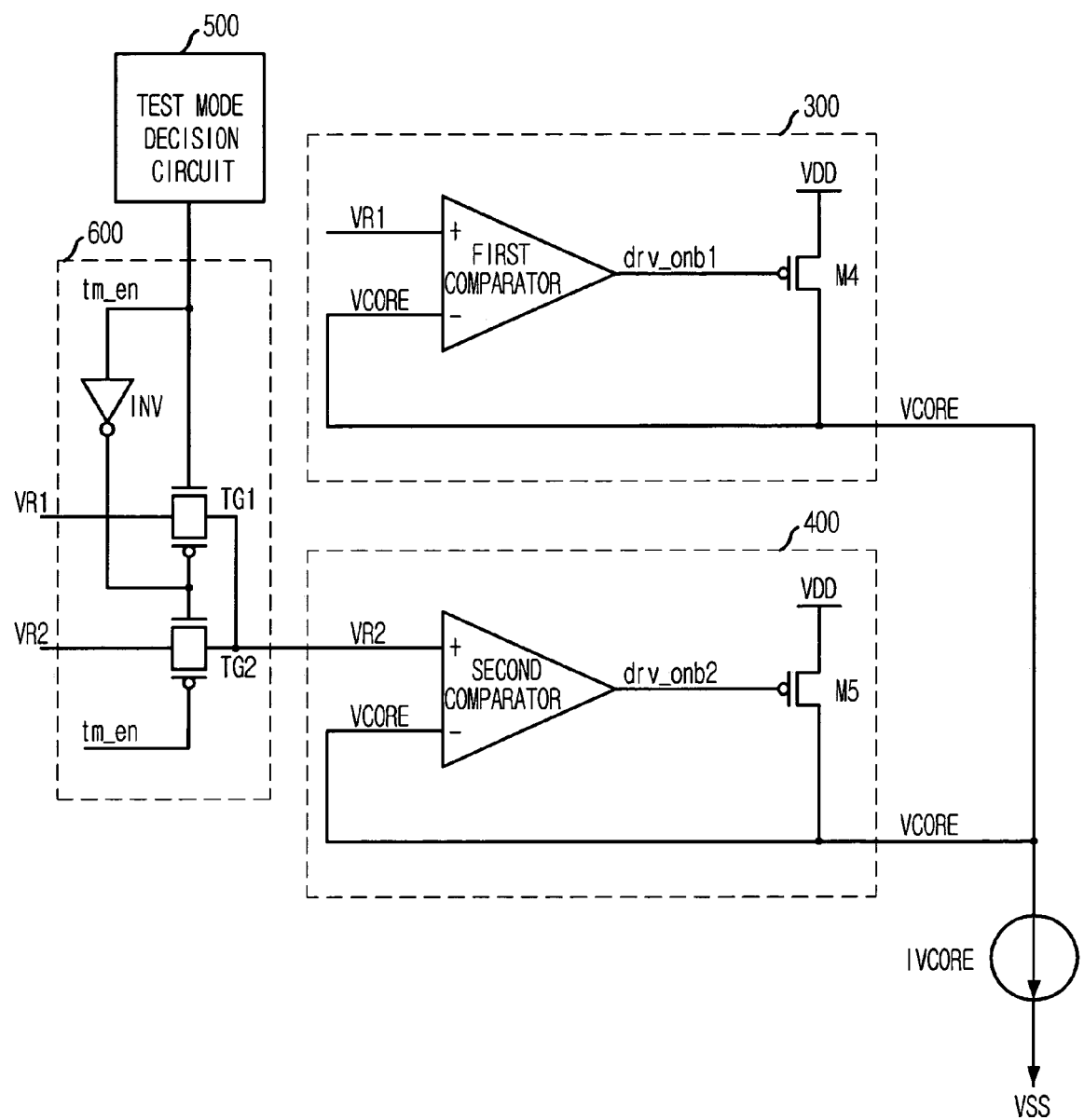
FIG. 6 is a circuit diagram illustrating a core voltage generator in accordance with another preferred embodiment of the present invention.

FIG. 6 is a circuit diagram illustrating a core voltage generator in accordance with another preferred embodiment of the present invention.

As shown, the core voltage generator in accordance with the present invention comprises a core voltage test mode decision circuit 500 for producing a core voltage test mode enable signal tm_en, a multiplexer 600 for generating the first reference voltage VR1 with core voltage target electrical potential, or the second reference voltage VR2, which is less than a level of the first reference voltage VR1, in response to the core voltage test mode enable signal tm_en, a first core voltage driver 300 for driving a core voltage terminal VCORE in response to the first reference voltage VR1, and a second core voltage driver 400 for driving the core voltage terminal VCORE in response to the second reference voltage VR2.

Herein, the multiplexer 600 includes a first and a second transmission gates TG1 and TG2 for providing the first reference voltage VR1 and the second reference voltage VR2, respectively, in response to the core voltage test mode enable signal tm_en and a core voltage test mode enable signal inverted by an inverter INV. Since the first and the second transmission gates TG1 and TG2 are controlled by the two core voltage test mode enable signals tm_en with different polarities, it would be possible to selectively output one of the first and the second reference voltages VR1 and VR2.

In the meantime, a configuration of the first and the second core voltage drivers 300 and 400 are the same as that shown in FIG. 4.

For example, if the core voltage test mode enable signal tm_en is activated with logic high level, then the first transmission gate TG1 is turned-on and the second transmission gate TG2 is turned-off, allowing the first reference voltage VR1 to be selected as reference voltage of the second core voltage driver 400. In contrast, if the core voltage test mode enable signal tm_en is inactivated with logic low level, then the second reference voltage VR2 is chosen as reference voltage of the second core voltage driver 400.

Meanwhile, it should be noted that the number or level of the reference voltages to the multiplexer 600 may be varied where required.

In case of internal voltage generator such as core voltage generator, since it is configured by analog circuits which do not perform digital signal process, there may be a case that its characteristics cannot be decided explicitly.

Thus, as mentioned above, testing after an addition of the test mode decider 500 and the multiplexer 600 makes reference voltage adapted to characteristics of a target device set as reference voltage of the second core voltage driver 400.

That is to say, although the core voltage generator of the invention is explained as only one embodiment, it should be noted that the invention can be also applied to different internal voltage generators under the inventive principle.

Further, even though the PMOS transistor is illustrated as core voltage driver in the embodiment, it may be substituted by one of other drivers.

Moreover, even though a simple feedback core voltage is used in the embodiment, the invention may be applied to various feedback manners that conduct feedback operation after a division of the core voltage.

Moreover, although two reference voltages with different levels are employed in the embodiment, there may be used reference voltages with more than three different levels.

As a result, the present invention can generate a stable internal voltage with constant level, while guaranteeing a drive force with respect to an internal voltage terminal. Using this generator, reliability and operation characteristics of semiconductor memory device can be improved.

The present application contains subject matter related to Korean patent application No. 2004-113626, filed in the Korean Patent Office on Dec. 28, 2004, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. An internal voltage generator for generating an internal voltage, comprising:
    a first internal voltage drive means for driving the internal voltage in response to a first reference voltage by supplying a power supply voltage to an internal voltage terminal when the internal voltage has a lower level than the first reference voltage to generate a first internal voltage;
    a second internal voltage drive means for driving the internal voltage in response to a second reference voltage having a lower level than the first reference voltage by supplying the power supply voltage to the internal voltage terminal when the internal voltage has a lower level than the second reference voltage to generate a second internal voltage; and
    an internal voltage output means for outputting the internal voltage by adding the first and the second internal voltages,
    wherein a voltage level of the first reference voltage corresponds to a target level of the internal voltage.

2. An apparatus for use in a semiconductor memory device, comprising:
    a first comparison means for comparing a first reference voltage corresponding to a target level of an internal voltage with a level of a feedback internal voltage;
    a first pull-up drive means for pull-up driving an internal voltage in response to a first drive control signal from the first comparison means to generate a first internal voltage;
    a second comparison means for comparing a second reference voltage having a lower level than the first reference voltage with a level of the feedback internal voltage;
    a second pull-up drive means for pull-up driving the internal voltage in response to a second drive control signal from the second comparison means to generate a second internal voltage; and
    an internal voltage output unit for outputting the internal voltage by adding the first and the second internal voltages.

3. The apparatus as recited in claim 2, wherein the first pull-up drive means includes:
    a first PMOS transistor, connected between a power supply voltage and the internal voltage, whose gate is coupled to the first drive control signal.

4. The apparatus as recited in claim 3, wherein the second pull-up drive means includes:

a second PMOS transistor, connected between the power supply voltage and the internal voltage, whose gate is coupled to the second drive control signal.

5. An apparatus for use in a semiconductor memory device, comprising:
- a first comparison means for comparing a first reference voltage corresponding to a target level of an internal voltage with a level of a feedback internal voltage;
- a first pull-up drive means for pull-up driving an internal voltage in response to a first drive control signal from the first comparison means to generate a first internal voltage;
- a test mode decision means for generating an internal voltage test mode enable signal;
- a multiplexing means for generating as a second reference voltage one of a plurality of reference voltages with different levels, which are lower than a level of the first reference voltage, in response to the internal voltage test mode enable signal;
- a second comparison means for comparing the second reference voltage from the multiplexing means with the level of the feedback internal voltage; and
- a second pull-up drive means for pull-up driving the internal voltage in response to a second drive control signal from the second comparison means to generate a second internal voltage; and
- an internal voltage output unit for outputting the internal voltage by adding the first and the second internal voltages.

6. The apparatus as recited in claim 5, wherein the multiplexing means includes;
- a first transmission gate for providing a reference voltage with a level which is identical to the first reference voltage, under the control of the internal voltage test mode enable signal; and
- a second transmission gate for providing a reference voltage with a level which is lower than the first reference voltage, under the control of the internal voltage test mode enable signal.

7. The apparatus as recited in claim 5, wherein the first pull-up drive means comprises a first PMOS transistor, connected between a power supply voltage and the internal voltage, whose gate is coupled to the first drive control signal.

8. The apparatus as recited in claim 6, wherein the second pull-up drive means comprises a second PMOS transistor, connected between the power supply voltage and the internal voltage, whose gate is coupled to the second drive control signal.

9. An apparatus for use in a semiconductor memory device, comprising:
- a first comparison unit for comparing a first reference voltage corresponding to a target level of an internal voltage with a level of a feedback internal voltage;
- a first pull-up drive unit for pull-up driving an internal voltage in response to a first drive control signal from the first comparison unit to generate a first internal voltage;
- a second comparison unit for comparing a second reference voltage having a lower level than the first reference voltage with a level of the feedback internal voltage;
- a second pull-up drive unit for pull-up driving the internal voltage in response to a second drive control signal from the second comparison unit to generate a second internal voltage; and
- an internal voltage output unit for outputting the internal voltage by adding the first and the second internal voltages.

10. The apparatus as recited in claim 9, wherein the first pull-up drive unit comprises a first PMOS transistor, connected between a power supply voltage and the internal voltage, whose gate is coupled to the first drive control signal.

11. The apparatus as recited in claim 10, wherein the second pull-up drive unit comprises a second PMOS transistor, connected between the power supply voltage and the internal voltage, whose gate is coupled to the second drive control signal.

* * * * *